United States Patent
Virunjipuram Murugesan et al.

(10) Patent No.: US 12,519,464 B2
(45) Date of Patent: Jan. 6, 2026

(54) CURRENT SENSING SWITCH CIRCUITRY WITH COMPENSATION

(71) Applicant: Infineon Technologies Austria AG, Villach (AT)

(72) Inventors: Saravanan Virunjipuram Murugesan, Villach (AT); Pawan Gupta, Andover, MA (US); James R. Garrett, Windham, NH (US)

(73) Assignee: Infineon Technologies Austria AG, Villach (AT)

( * ) Notice: Subject to any disclaimer, the term of this patent is extended or adjusted under 35 U.S.C. 154(b) by 43 days.

(21) Appl. No.: 18/664,572

(22) Filed: May 15, 2024

(65) Prior Publication Data
US 2025/0357924 A1   Nov. 20, 2025

(51) Int. Cl.
| | | |
|---|---|---|
| *H03K 17/0812* | (2006.01) | |
| *G05F 3/26* | (2006.01) | |
| *H01C 17/232* | (2006.01) | |
| *H03M 1/78* | (2006.01) | |
| *H03K 17/08* | (2006.01) | |

(52) U.S. Cl.
CPC ....... *H03K 17/08122* (2013.01); *G05F 3/262* (2013.01); *H01C 17/232* (2013.01); *H03M 1/785* (2013.01); *H03K 2017/0806* (2013.01); *H03K 2217/0027* (2013.01)

(58) Field of Classification Search
None
See application file for complete search history.

(56) References Cited

U.S. PATENT DOCUMENTS

| | | | |
|---|---|---|---|
| 10,608,625 B1 * | 3/2020 | Bernacchia | H03K 17/163 |
| 10,715,136 B2 * | 7/2020 | Zuniga | H03K 17/687 |
| 10,903,831 B2 * | 1/2021 | Iwata | H03K 17/0828 |
| 11,493,542 B2 * | 11/2022 | Yokoi | G01R 19/10 |

* cited by examiner

*Primary Examiner* — Jeffrey S Zweizig
(74) *Attorney, Agent, or Firm* — Armis IP Law, LLC

(57) ABSTRACT

An apparatus such as a switch circuit providing current monitoring as discussed herein may include a first switch fabricated via first semiconductor technology, a second switch fabricated via second semiconductor technology, and current monitor circuitry. The current monitor circuitry may include the second switch. The current monitor circuitry can be configured to provide mirroring of a magnitude of second current through the second switch with respect to a magnitude of first current through the first switch. The apparatus as discussed herein may further include a signal converter operative to convert a first control signal controlling the first switch into a second control signal operative to control the second switch. Additionally, the apparatus as discussed herein may include a gate drive voltage compensation circuit and/or a temperature compensation circuit to provide compensation and a more accurate output signal indicating a magnitude of the first current through the first switch.

20 Claims, 13 Drawing Sheets

CURRENT SENSING SWITCH CIRCUITRY WITH COMPENSATION

BACKGROUND

Conventional current mirror circuits are typically configured to copy a primary current through a first transistor by controlling the current through a second transistor. In general, a magnitude of the copied current through the second transistor is equal to or at least proportional to a magnitude of the primary current through the first transistor.

Typically, when implementing a current mirror circuit, the first transistor and the second transistor as previously discussed are fabricated from the same semiconductor fabrication process such that at least the most relevant operating characteristics associated with the first transistor and the second transistor are identical.

BRIEF DESCRIPTION

Implementation of clean energy (or green technology) is very important to reduce our impact as humans on the environment. In general, clean energy includes any evolving methods and materials to reduce an overall toxicity of energy consumption on the environment.

This disclosure includes the observation that raw energy, such as received from green energy sources or non-green energy sources, typically needs to be converted into an appropriate form (such as desired AC voltage, DC voltage, etc.) before it can be used to power end devices such as servers, computers, mobile communication devices, etc. Regardless of whether energy is received from green energy sources or non-green energy sources, it is desirable to make most efficient use of raw energy provided by such systems to reduce our impact on the environment. This disclosure contributes to reducing our carbon footprint (and green energy) via more efficient energy conversion and circuit implementations supporting same.

An apparatus as discussed herein includes: a first switch (such as a so-called power field effect transistor or other suitable entity) such as disposed in a first semiconductor chip fabricated via first semiconductor technology; a second switch such as disposed in a second semiconductor chip fabricated via second semiconductor technology; and current monitor circuitry including the second switch, the current monitor circuitry operative to provide mirroring of the second current through the second switch with respect to first current through the first switch.

In one example, via the current mirroring, a magnitude of the second current (iS) is a proportion of a magnitude of the first current (IL) such that $iS=(1/N)*iL$, where N defines a ratio value.

In further examples, the circuit as discussed can be configured to include: a first node operative to receive a first control signal controlling operation of the first switch, the controlled operation of the first switch is operative to control a magnitude of a resistance between a drain node of the first switch and a source node of the first switch. The circuit as discussed herein may further include a signal converter operative to convert the first control signal received at the first node into a second control signal operative to control operation of the second switch.

In another example, via the current mirroring functionality and derivation of the second control signal based on the first control signal as discussed herein, the generated second control signal is operative to control a second resistance between a drain node of the second switch and a source node of the second switch such that a magnitude of the second current through the second switch is proportional to the magnitude of the first current through the first switch. In other words, the current mirroring functionality as discussed herein includes controlling a magnitude of the second current through the second switch to be proportional to a magnitude of the first current through the first switch.

Note that the derived second control signal may be applied to a gate node of the second switch. Further note that the signal converter as discussed herein can be configured to include a resistor divider circuit operative to produce a magnitude of the second control signal as a proportion of a magnitude of the first control signal.

Yet further, note that a magnitude of the first control signal (controlling the first switch) may vary within a first voltage range. The signal converter can be configured to control a magnitude of the second control signal (used to control the second switch) to be within a second voltage range. In one example, the second voltage range is smaller than the first voltage range.

In accordance with further examples as discussed herein, the first switch may be a power switch fabricated on a first semiconductor chip where the first switch is fabricated in accordance with MOSFET (Metal Oxide Semiconductor Field Effect Transistor) or other suitable first semiconductor chip fabrication technology. The second switch may be fabricated as a so-called sense switch fabricated on a second semiconductor chip in which the second semiconductor chip is fabricated in accordance with CMOS (Complementary Metal Oxide Semiconductor) or other suitable second semiconductor chip fabrication technology. Thus, the second semiconductor chip may be fabricated independent of the first semiconductor chip.

In accordance with still further examples as discussed herein, the current monitor circuitry may be configured to produce an output signal indicating a magnitude of the first current through the first switch. The apparatus as discussed herein may further include a temperature compensation circuit operative to: i) receive a temperature value generated by a temperature sensor circuit disposed on a semiconductor chip including the second switch, and ii) adjust a magnitude of the output signal as a function of a magnitude of the temperature value.

Still further, as discussed herein, the current monitor circuitry can be configured to generate an output signal indicating a magnitude of the first current based on generation of the output signal from a magnitude of the second current. The current monitor circuitry may further include a temperature compensation circuit operative to: i) receive a temperature value indicative of a temperature of the second switch, and ii) adjust the output signal as a function of the received temperature value. Temperature compensation as discussed herein can be achieved in any suitable manner. In one example, the temperature compensation circuit is operative to sink current from the output signal of the current monitor circuitry during a first condition in which a magnitude of the temperature value is below a threshold level; and the temperature compensation circuit is operative to source current to the output signal during a second condition in which the magnitude of the temperature value is above a threshold level.

In still further examples, as previously discussed, the current monitor circuitry as discussed herein can be configured to generate an output signal indicating a magnitude of the first current through the first switch based on monitoring of a magnitude of the second current through the second switch. The current monitor circuitry further can be configured to include a drive voltage compensation circuit operative to: i) receive a drive voltage value indicative of a drive voltage applied to the first switch, and ii) adjust the output signal as a function of the received drive voltage.

The output signal may be an output current whose magnitude indicates a magnitude of the first current. The drive voltage compensation circuit can be configured to sink current from the output current during a first condition in which a magnitude of the drive voltage value is below a threshold level. The drive voltage compensation circuit may be operative to source current to the output current during a second condition in which the magnitude of the drive voltage value is above a threshold level. Thus, the drive voltage compensation can be implemented via sinking or sourcing current from the output signal such that the output signal (derived from the second current) accurately represents the magnitude of the first current.

In still further examples, the current monitor circuitry as discussed herein can be configured to include a signal converter operative to: i) receive a first control signal applied to the first switch, ii) receive a temperature signal indicating a temperature of the second switch, iii) produce a drive signal based on the first control signal and the temperature signal, and iv) apply the drive signal to a gate node of the second switch.

Yet further, note that the circuitry as discussed herein can be configured to include a first node operative to receive a first control signal. The first control signal can be configured to control a corresponding resistance associated with the first switch. The control of the first switch may control a magnitude of a resistance between a source node of the first switch and a drain node of the first switch. An implementation of the signal converter as discussed herein may be operative to: i) receive a second signal derived from the first control signal, the second signal indicating a magnitude of the first control signal, ii) receive a temperature signal indicating a temperature of the second switch, iii) produce a drive signal based on the second signal and the temperature signal, and iv) apply the drive signal to a gate node of the second switch.

In still further examples, the current monitor circuitry may include multiple switches connected in parallel with the second switch. The multiple switches may include third switch circuitry and fourth switch circuitry. The current monitor circuitry as discussed herein may further include a first signal converter and a second signal converter. In such an instance, the first signal converter can be configured to: i) receive a temperature signal indicating a temperature of the second switch, ii) convert the temperature signal into a first control signal applied to the third switch circuitry. The second signal converter can be configured to: i) receive a switch driver signal applied to the first switch, ii) convert the switch drive signal into a second control signal applied to the fourth switch circuitry. The first control signal can be configured to provide temperature compensation associated with generation of an output signal indicating a magnitude of the first current through the first switch, the output signal derived from the second current; and the second control signal may be operative to provide drive voltage compensation associated with generation of the output signal.

Note further that the current monitor circuitry as discussed herein can be configured to include first resistors (such as first resistive paths) fabricated from first resistive material and second resistors (such as second resistive path) fabricated from second resistive material. The first resistors and the second resistors may be disposed in the current mirror circuit of the current monitor circuitry. In one example, the first resistive material has a first temperature coefficient; the second resistive material has a second temperature coefficient. The first switch can be configured to have a first RDSon temperature coefficient; the second switch can be configured to have a second RDSon temperature coefficient. Yet further, the first temperature coefficient and the second temperature coefficient can be selected such that a magnitude of a first ratio of the second temperature coefficient of the second resistive material to the first temperature coefficient of the first resistive material is substantially equal to a magnitude of a second ratio of the second RDSon temperature coefficient of the second switch to the first RDSon temperature coefficient of the first switch. The first resistive material and the second resistive material can be configured to provide temperature compensation of converting the second current into an output signal indicating a magnitude of the first current. In one example, a magnitude of the first temperature coefficient is less than a magnitude of the second temperature coefficient. In other words, the first material may be a low temperature coefficient material while the second resistive material may be a high temperature coefficient material.

Further examples as discussed herein include a method comprising: receiving a first switch fabricated via first semiconductor technology; receiving a second switch fabricated via second semiconductor technology; fabricating current monitor circuitry to include the second switch, the current monitor circuitry operative to provide mirroring of a magnitude of second current through the second switch with respect to a magnitude of first current through the first switch; and fabricating the current monitor circuitry to include compensation circuitry, the compensation circuitry operative to adjust a magnitude of an output signal derived from the second current such that the magnitude of the output signal is representative of a magnitude of the first current through the first switch.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of techniques herein (BRIEF DESCRIPTION) purposefully does not specify every novel aspect of the present disclosure or claimed invention(s). Instead, this brief description only presents general aspects and corresponding points of novelty over conventional techniques. For additional details and/or possible perspectives (permutations) of the invention(s), the reader is directed to the Detailed Description section (which is a summary) and corresponding figures of the present disclosure as further discussed below.

BRIEF DESCRIPTION AND DRAWINGS

Figure 1:
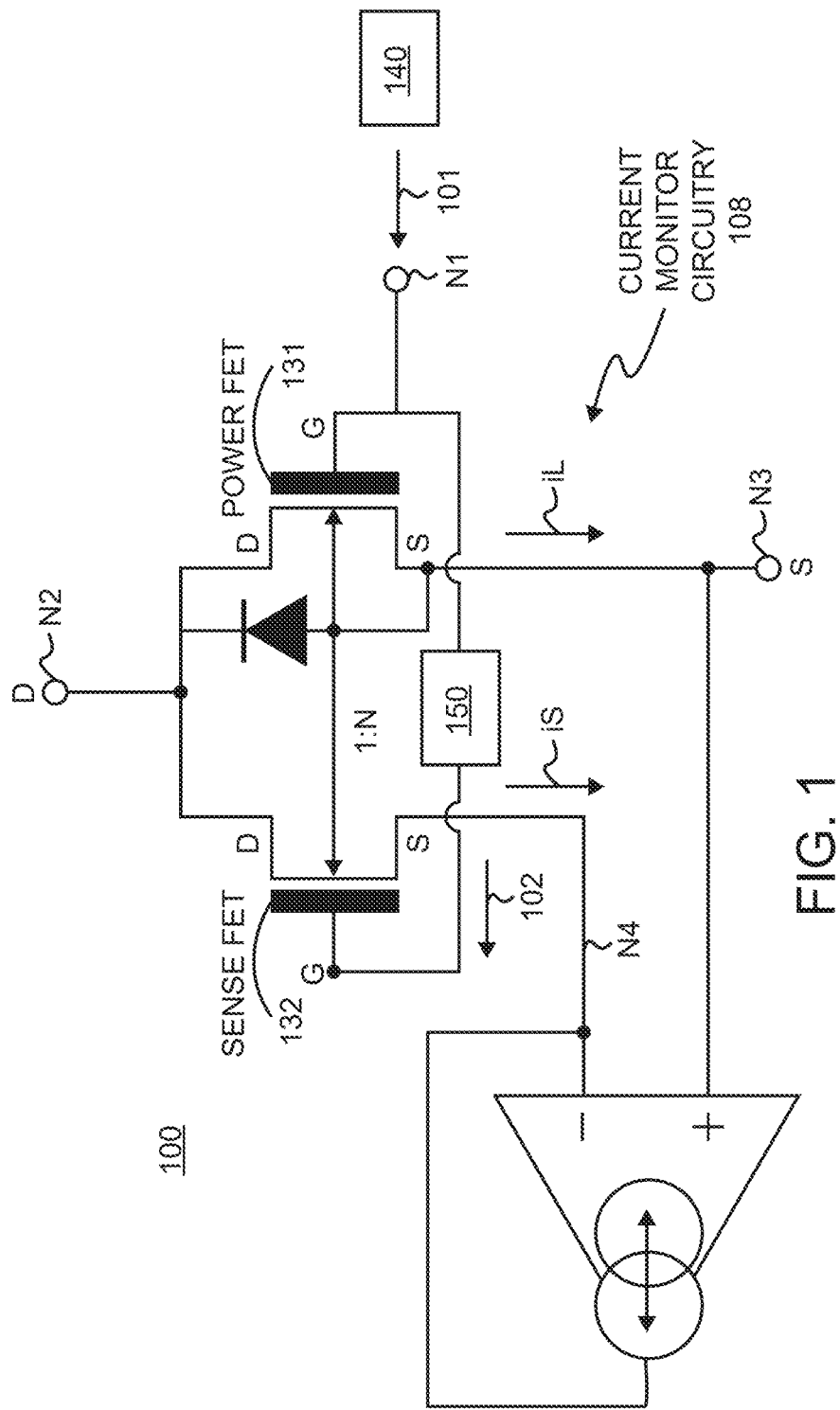
FIG. 1 is an example diagram illustrating implementation of switch circuitry and current monitor circuitry as discussed herein.

The foregoing and other objects, features, and advantages of the disclosed matter herein will be apparent from the following more particular description herein, as illustrated in the accompanying drawings in which like reference characters refer to the same parts throughout the different views. The drawings are not necessarily to scale, with emphasis instead being placed upon illustrating the principles, concepts, aspects, techniques, etc.

DETAILED DESCRIPTION

An apparatus such as a switch circuit providing current monitoring as discussed herein may include a first switch (such as in a first semiconductor chip) fabricated via first semiconductor technology, a second switch (such as in a second semiconductor chip) fabricated via second semiconductor technology, and corresponding current monitor circuitry. The current monitor circuitry may include the second switch.

The current monitor circuitry can be configured to provide mirroring of second current through the second switch with respect to first current through the first switch. Because the first and second switches may support different input drive voltage ranges (such as because they are fabricated from different semiconductor fabrication processes), the apparatus (circuit) as discussed herein may include a signal converter operative to convert a first control signal controlling the first switch into a second control signal operative to control the second switch. The signal converter enables simultaneous control of both switches to similar on/off states since the logic level of the second control signal follows the logic of the first control signal.

Further, the current monitor circuitry as discussed herein can be configured to derive an output signal based on monitoring a magnitude of the second current, which basically tracks a magnitude of the first current via mirroring. The output signal indicates a magnitude of the current through the second switch, which in theory, is proportional and indicative of the first current through the first switch.

There are potentially inaccuracies associated with mirroring the first current into the second current because of the different technologies used to fabricate the first transistor and the second transistor. Thus, use of the second current to produce the output signal without compensation may result in the output signal from the current monitor circuitry being an inaccurate representation of the magnitude of the first current. The apparatus as discussed herein may include one or more of a gate drive voltage compensation circuit and/or a temperature compensation circuit to provide compensation to the output signal such that the compensated output signal from the current monitor is a more accurate representation of the magnitude of the first current through the first switch. In other words, the compensation circuitry as discussed herein enables use of the switches fabricated in accordance with different technologies to produce an accurate output signal indicating a magnitude of current to the first switch.

Now, more specifically, FIG. 1 is an example diagram illustrating an apparatus comprising switch circuitry and current monitor circuitry as discussed herein.

In this example, the circuit 100 includes multiple components such as switch 131, switch 132, signal converter 150, and current monitor circuitry 108.

As shown, the switch 131 such as a so-called power field effect transistor or other suitable entity is coupled (a.k.a., connected) between the node N2 and node N3. For example, the drain node D of the switch 131 is directly coupled (a.k.a., connected) to the node N2. The source node S of the switch 131 is directly connected to the node N3. In one example, as further discussed herein, the magnitude of the current iL through the first switch 131 is N times larger than the magnitude of the current iS through the switch 132.

Note further that the circuit 100 can be configured to include a controller 140. The controller 140 produces a respective control signal 101 applied to the gate node G (a.k.a., node N1) of the circuit 100. In general, a logic high voltage applied to the gate node G of the switch 131 activates the switch 131 such that there is a low resistive path between the drain node D and the source node S of the switch 131. Conversely, a logic low voltage applied to the gate node G of the switch 131 deactivates the switch 131 to an OFF-state such that there is a high resistive path between the drain node D and the source node S of the switch 131.

Accordingly, the controller 140 can be configured to control the switch 131 to ON-states and OFF-states depending upon a magnitude of the control signal 101.

In accordance with further examples as discussed herein, the switch 131 (such as one or more switches connected in parallel) can be fabricated in accordance with first semiconductor technology. The controller can be configured to produce the control signal 101 in a first range defined by a first logic high voltage and a first logic low voltage associated with the first semiconductor technology. For example, the specification associated with the first switch 131 may be first logic high voltage may be 5 volts DC while the first logic low voltage may be 0 volts DC.

The switch 132 (such as one or more switches connected in parallel) can be fabricated in accordance with second semiconductor technology requiring a different range of voltages (such as a smaller input voltage range associated with driving the switch 131) applied to the gate node (G) of the switch 132. In such an instance, it is not desirable to simply drive the gate node of the switch 132 with the control signal 101 because the switch 132 may not tolerate application of the first logic voltage such as 5 volts DC applied to its gate node. To address this issue, the circuit 100 can be configured to include signal converter 150. The signal converter 150 can be configured to derive a control signal 102 from the control signal 101. In one example, the signal converter 150 produces the control signal 102 to fall within a second range defined by a second logic high voltage and a second logic low voltage. For example, the second logic high voltage may be 3 volts DC while the second logic low voltage may be 0 volts DC.

In one example, as further discussed herein, the signal converter 150 can be configured to produce the magnitude of the control signal 102 to be 60 percent (or some other suitable gain value) of the magnitude of the control signal 101. Thus, in one example, it is desirable to simultaneously activate the switch 131 and the switch 132 to respective ON-states when a magnitude of the control signal 101 is a logic high (such as 5 volts DC); it is desirable to simultaneously deactivate the switches 131 and the switch 132 to OFF-states when the magnitude of the control signal 101 is logic low (such as 0 volts DC).

As further shown, the first current iL flows from the node N2 through the switch 131 to the node N3. The second current iS flows from the node N2 through the switch 132 to the node N4.

It is further noted that the circuit 100 and corresponding switch 131 and switch 132 support current mirroring. For example, the current monitor circuitry 108 (a.k.a., current sense circuitry) includes the second switch 132. The current monitor circuitry 108 is operative to provide mirroring of the second current iS through the second switch 132 with respect to first current iL through the first switch 131.

More specifically, as previously discussed, the controller 140 is configured to control a state of the switch 131. Via the current mirroring between the switch 131 and switch 132, a magnitude of the second current (iS) is a proportion (ratio) of a magnitude of the first current (iL) such that $iS=(1/N)*iL$, where N is a ratio value associated with the current monitor circuitry 108.

Accordingly, the circuit 100 as discussed herein can be configured to include a first node N1 operative to receive a first control signal 101 from the controller 140. The control signal 101 controls operation of the first switch 131 between an ON-state and an OFF-state. The controlled operation of the first switch 131 controls a magnitude of a resistance between a source node S of the first switch 131 and a drain node D of the first switch 131. As its name suggests, the signal converter 150 converts the first control signal 101 received at the first node N1 into a second control signal 102 operative to control operation of the second switch 132. The second control signal 102 is applied to a gate node G of the second switch 132.

As discussed in detail below, the current monitor circuitry 108 can be configured to produce an output signal indicating a magnitude of the first current iL based on the amount of current iS detected as flowing through the second switch 132.

Figure 2:
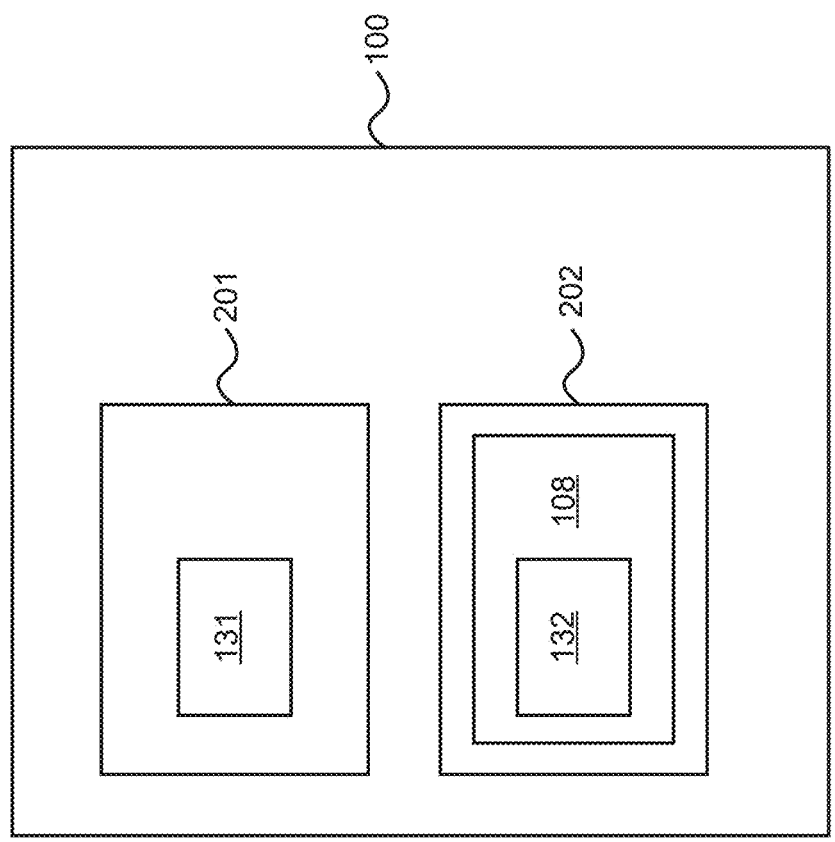
FIG. 2 is an example diagram illustrating implementation of multiple different semiconductor chips implemented in a circuit as discussed herein.

FIG. 2 is an example diagram illustrating implementation of multiple semiconductor chips to implement the circuitry as discussed herein.

In this example, the circuit 100 is implemented via a combination of semiconductor chip 201 and semiconductor chip 202. The semiconductor chip 202 may be fabricated to include the switch 132 and corresponding current monitor circuitry 108. The semiconductor chip 201 may be fabricated to include the switch 131. Interconnectivity of the switch 131, switch 132, and corresponding current monitor circuitry 108 is shown in other FIGS.

As previously discussed, the first switch 131 such as a power switch (field effect transistor) may be fabricated on the first semiconductor chip 201. The first switch 131 (field effect transistor) may be fabricated in accordance with a first technology such as MOSFET (Metal Oxide Semiconductor Field Effect Transistor) or other suitable technology.

The second switch 132 such as a so-called sense switch (field effect transistor) may be fabricated on the second semiconductor chip 202. The second semiconductor chip 202 may be fabricated in accordance with CMOS (Complementary Metal Oxide Semiconductor), BICMOS (Bipolar Complementary Metal Oxide Semiconductor), or any other suitable technology.

Accordingly, the second semiconductor chip 202 may be fabricated independent of the first semiconductor chip 201. In one example, the first semiconductor chip 201 (including the switch 131) is cut from a first wafer of multiple identical or different first semiconductor chips fabricated in accordance with the first semiconductor fabrication technology. The second semiconductor chip 202 (including the switch 132) is cut from a wafer of multiple identical or different second semiconductor chips fabricated in accordance with the second semiconductor fabrication technology.

Figure 3:
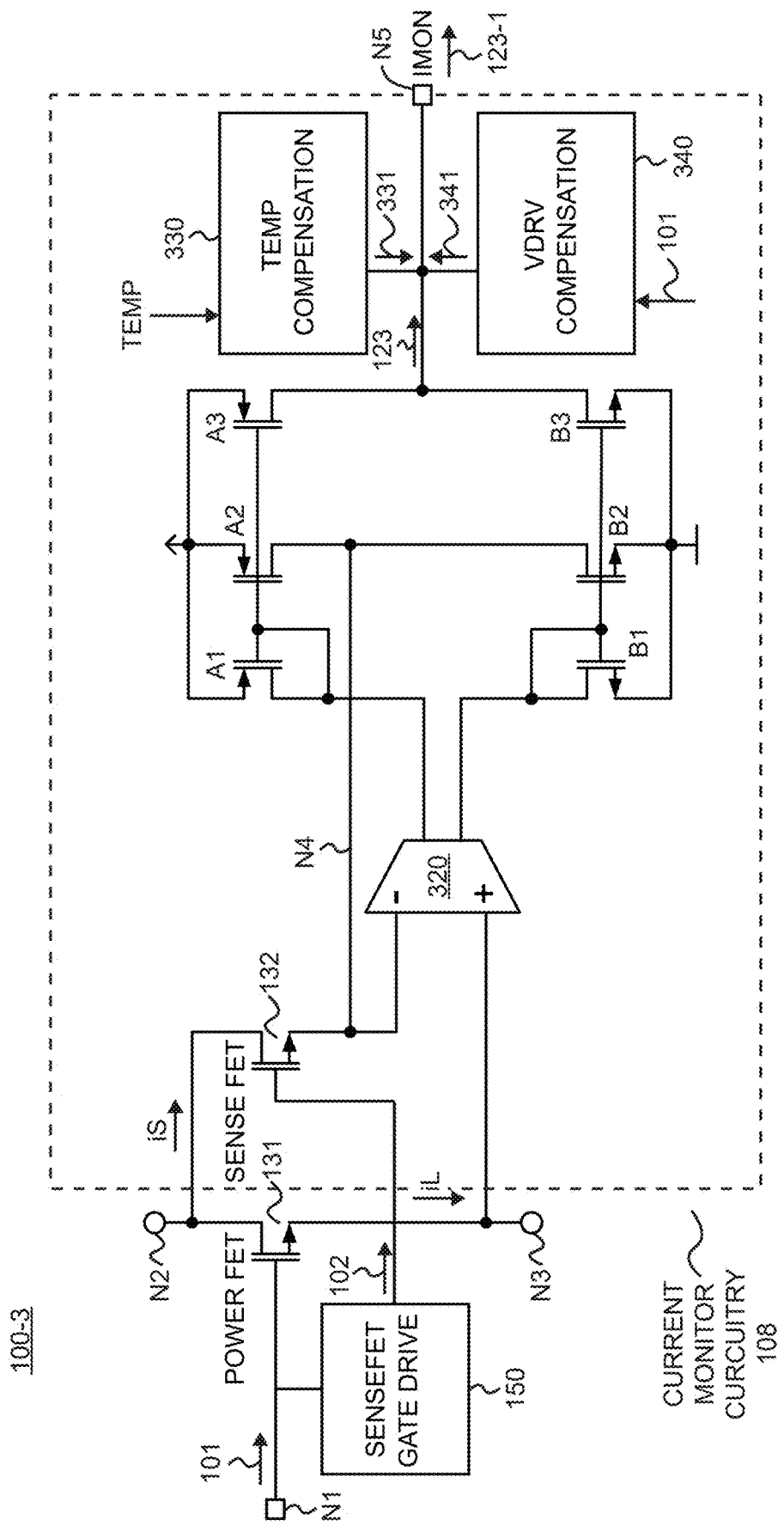
FIG. 3 is an example diagram illustrating current monitor circuitry implementing compensation as discussed herein.

FIG. 3 is an example diagram illustrating switch circuitry and corresponding current monitor circuitry (including compensation circuitry) as discussed herein.

As shown, the implementation of circuit 100-3 (instantiation of circuit 100) may include signal converter 150, switch 131, switch 132, and current monitor circuitry 108. The current monitor circuitry 108 in this example includes switch 132, operational amplifier 320, switches A1, A2, and A3, switches B1, B2, and B3, temperature compensation circuit 330, and the voltage drive compensation circuit 340.

Further in this example, as previously discussed, the control signal 101 controls operation of the switch 131 and a corresponding magnitude of the first current iL conveyed from node N2 through the switch 131 to the node N3.

As previously discussed, the switch 132 is implemented in a current mirror configuration in which the current iS through the switch 132 ratiometrically tracks a magnitude of the current iL through the switch 131.

More specifically, as previously discussed, via the current mirroring between the switch 131 and switch 132 supported by the current monitor circuitry 108, a magnitude of the second current (iS) is a proportion (ratio) of a magnitude of the first current (iL) such that $iS=(1/N)*iL$, where N is a ratio value. As further shown, the combination of circuitry including operational amplifier 320, first switches (A1, A2, A3), and second switches (B1, B2, and B3) produce a respective output signal 123 whose magnitude is approximately a value proportional to a magnitude of the second current iS.

As previously discussed, the switch 131 is fabricated in accordance with a first semiconductor chip technology; the switch 132 is fabricated in accordance with a second semiconductor chip technology. In such an instance, there is not good tracking of the switch 131 and the switch 132 based on temperature or magnitude of the drive voltage (control signal 101). To provide compensation for the chip fabrication technology mismatches associated with the implementation of the switch 131 and the switch 132, the current monitor circuitry 108 may include temperature compensation circuitry 330 and driver voltage compensation circuitry 340.

In one example, based on a received temperature value (TEMP) such as indicating a respective temperature of the semiconductor chip 201 or any component thereon, the temperature compensation circuitry 330 produces the compensation signal 331 applied to the output signal 123 (not yet compensated) to produce the output signal 123-1. In this example, the output signal 123-1 is outputted from the output node N5 (a.k.a., IMON).

In general, the compensation signal 331 applied to the output signal 123 produces the compensated output signal 123-1. Because the temperature compensation circuitry 330 reduces errors, the compensated output signal 123-1 more closely tracks a magnitude of the first current iL than the output signal 123.

Based on a received voltage drive signal (a.k.a., control signal 101) such as associated with controlling the switch 131, the voltage driver compensation circuitry 340 produces the compensation signal 341 applied to the output signal 123.

In general, the compensation signal 341 applied to the output signal 123 produces the compensated output signal 123-1. The compensated output signal 123-1 more closely tracks a magnitude of the first current iL than the output signal 123.

Additional details of implementing compensation are discussed below.

Figure 4:
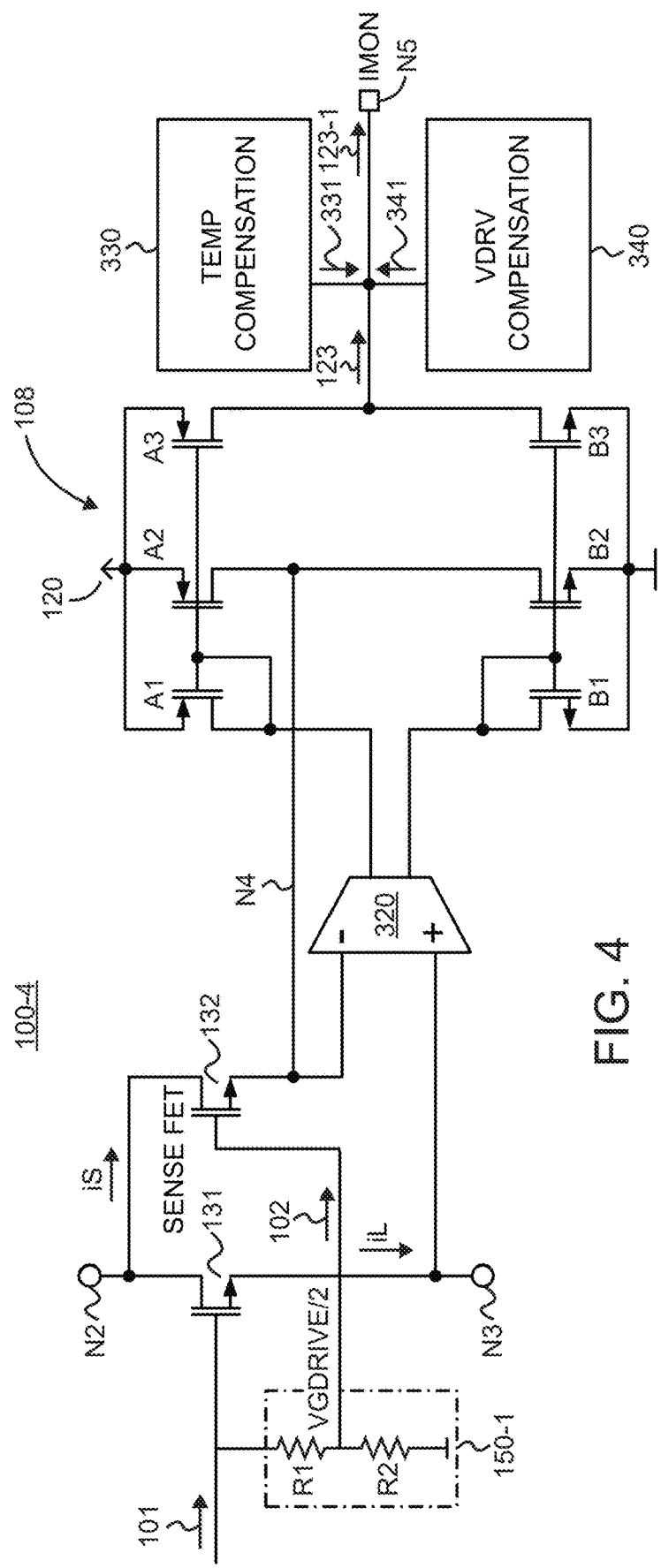
FIG. 4 is an example diagram illustrating implementation of signal converter circuitry in a circuit as discussed herein.

FIG. 4 is an example diagram illustrating implementation of signal converter circuitry as discussed herein.

In this example, the signal converter 150 is implemented as signal converter 150-1 including multiple resistors such as a resistor R1 and resistor R2. The ratio of the resistor ladder R1 and R2 controls a magnitude of the control signal 102.

For example, the magnitude of the control signal 102 outputted from the signal converter 150-1 is equal to the ratio (R2/[R1+R2]) multiplied by a magnitude of the control signal 101.

Accordingly, the signal converter 150-1 as discussed herein can be configured to include a resistor divider circuit operative to produce a magnitude of the second control signal 102 as a proportion of a magnitude of the first control signal 101.

As previously discussed, the controller 140 can be configured to produce the control signal 101 to be within a first voltage range such as between 0 volts (controlling switch 131 to an OFF-state) and 5 volts (controlling switch 131 to an ON-state). The signal converter 150-1 is operative to control a magnitude of the second control signal 102 within a second voltage range such as between 0 volts (controlling switch 132 to an OFF-state) and 3 volts (controlling switch 132 to an ON-state).

In such an instance, the second voltage range (between 0 and 3 volts) of controlling switch 132 is smaller than the first voltage range (between 0 and 5 volts) of controlling switch 131.

Note again that the magnitude of the input voltage ranges to the switches and corresponding low-voltage and high-voltage values may vary depending upon the example implementation.

Figure 5:
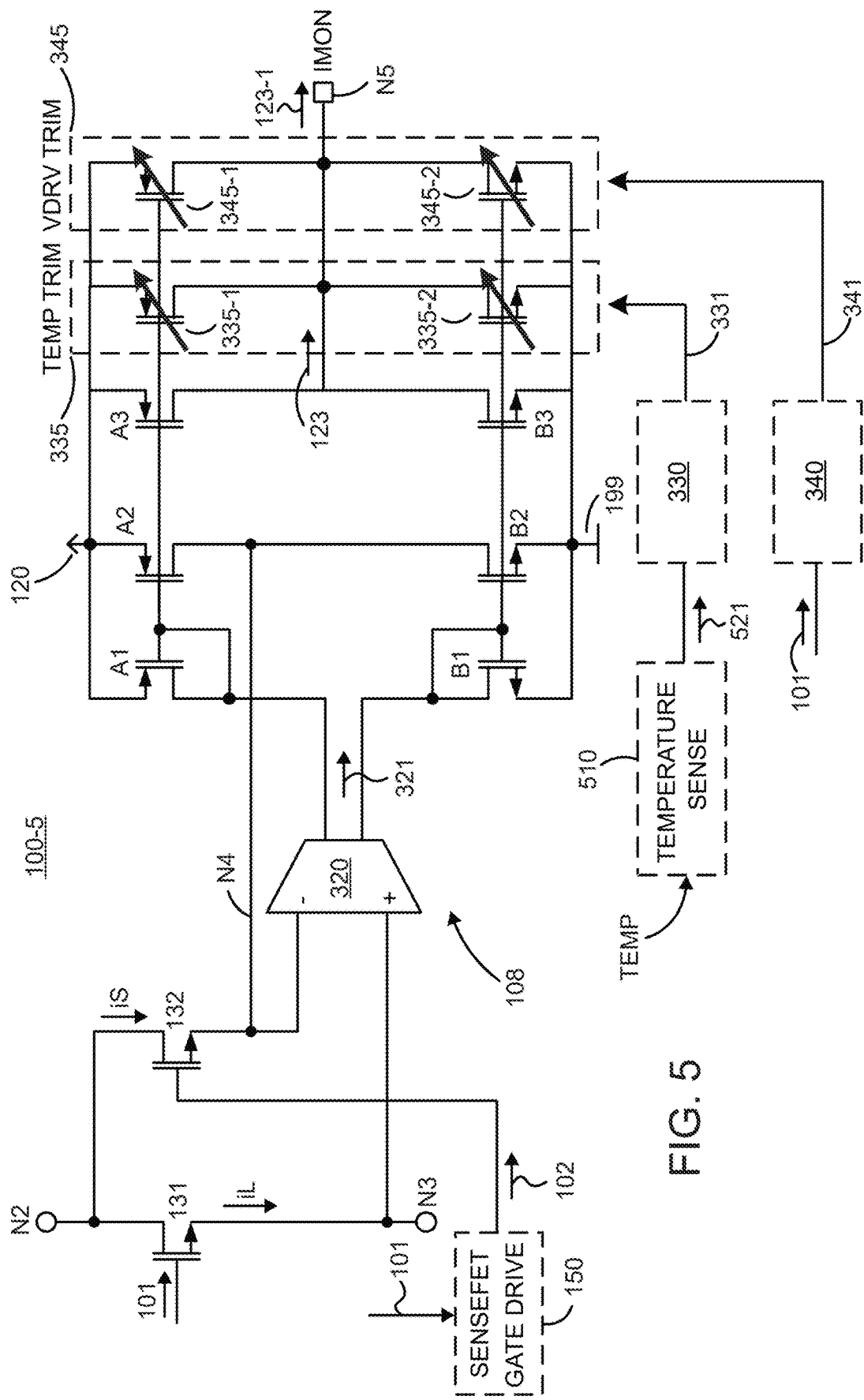
FIG. 5 is an example diagram illustrating signal converter circuitry and compensation circuitry as discussed herein.

FIG. 5 is an example diagram illustrating signal converter circuitry and compensation circuitry as discussed herein.

In this example, a novel current sensing architecture provides good accuracy even when using FETs (field effect transistors such as switch 131 and switch 132) from different technologies. If desired, the circuit as discussed herein can be configured to digitize the temperature sense output. The digitized temperature sensor output may be used to trim the current monitor output accordingly to implement the temperature correction on current monitor output. Yet further, the circuitry as discussed herein can be configured to vary the gate drive voltage (control signal 102) of the switch 132 (so called sensefet) in relation to the variation of the gate drive voltage (control signal 101) of the switch 131 (so called powerfet). The circuitry further can be configured to digitize the gate drive voltage (control signal 101) of the powerfet and trim the current monitor output accordingly to implement the gate drive voltage correction on current monitor output.

More specifically, as shown in FIG. 5, the circuit 100-5 such as an instantiation of the circuit 100 as previously discussed, includes the signal converter 150. The signal converter 150 receives the input control signal 101 and converts it into the control signal 102. The control signal 101 controls operation of the switch 131. The control signal 102 controls operation of the switch 132.

The operational amplifier 320 receives a differential voltage as input from a combination of node N3 (coupled to the noninverting input of the operational amplifier 320) and node N4 (coupled to the inverting input of the operational amplifier 320). The combination of the output 321 of the operational amplifier 320 and the voltage at node N4 controls operation of the switches A1, A2, A3, B1, B2, B3, to produce the output signal 123.

In one example, as previously discussed, the output signal 123 is a current signal whose magnitude varies depending upon a magnitude of the current iS through the switch 132.

Additionally, circuit 100-5 includes temperature compensation circuitry 330, temperature trim switches 335, voltage driver compensation circuitry 340, and voltage driver trim switches 345.

In this example, the temperature trim switches 335 may include first temperature trim switches 335-1 (one or more switches parallel to switches A1, A2, A3) supporting sourcing of compensation current from the voltage source 120 to the output node N5 and second temperature trim switches 335-2 (one or more switches parallel to switches B1, B2, B3) supporting sinking of compensation current from the node N5 to the ground reference potential 199.

The voltage driver trim switches 345 may include first voltage driver trim switches 345-1 (one or more switches parallel to switches A1, A2, A3) supporting sourcing of current from the voltage source 120 to the output node N5 and second voltage driver trim switches 345-2 (one or more switches parallel to switches B1, B2, B3) supporting sinking of current from the node N5 to the ground reference potential 199.

In general, as its name suggests, the temperature compensation circuitry 330 and the temperature trim switches 335 provide temperature compensation to the output signal 123 to produce the output signal 123-1.

For example, as previously discussed, based on control input 331 from the temperature compensation circuitry 330, temperature trim switches 335-1 can be configured to source compensation current to the output signal 123 to produce the output signal 123-1. Additionally, based on control input 331 from the temperature compensation circuitry 330, temperature trim switches 335-2 can be configured to sink current from the output signal 123 to produce the output signal 123-1.

Additionally, as its name suggests, the voltage driver compensation circuitry 340 and the voltage driver trim switches 345 provide voltage driver compensation to the output signal 123 to produce the output signal 123-1. For example, based upon the control input 341 from the voltage driver compensation circuitry 340, the voltage driver trim switches 345-1 can be configured to source supplemental current to the output signal 123 to produce the output signal 123-1. Additionally, based on control input 341 from the voltage driver compensation circuitry 340, the voltage driver trim switches 345-2 can be configured to sink current from the output signal 123 to produce the output signal 123-1.

Further in this example, the circuit 100-5 includes the temperature sensor circuitry 510. The temperature sensor circuitry 510 monitors the temperature (TEMP) associated with the switch 132 or corresponding semiconductor chip 202 or any suitable circuitry. Based upon the detected temperature, the temperature sensor circuitry 510 produces the corresponding temperature signal 521. In one example, the temperature signal 521 is a voltage whose magnitude varies depending upon a magnitude of the detected temperature (TEMP). The magnitude of the voltage associated with the temperature signal 521 may vary by any suitable amount such as 8 millivolts per degree Celsius change or other suitable amount.

As further shown, the temperature compensation circuitry 330 (such as including an analog to digital converter or other suitable entity) converts the received temperature signal 521 into the control input 331 used to control operation of the temperature trim switches 335. Based on controlling activation of the temperature trim switches 335 via the control input 331, the temperature compensation circuitry 330 provides temperature compensation to the output signal 123 to produce the output signal 123-1. In other words, the temperature compensation circuitry 330 controls the temperature trim switches 335 to sink or source current to the output signal 123 to provide temperature compensation and produce the output signal 123-1.

Further in this example, circuit 100-5 includes the voltage driver compensation circuitry 340. The voltage driver compensation circuitry 340 receives the control signal 101 applied to the switch 131. Based upon the magnitude of the control signal 101, as previously discussed, the voltage driver compensation circuitry 340 provides compensation to the output signal 123 to produce the compensated output signal 123-1. For example, as further shown, the voltage driver compensation circuitry 340 (such as an analog to digital converter or other suitable entity) converts the received control signal 101 into the control input 341 used to control operation of the voltage driver trim switches 345. Based on controlling activation of the voltage driver trim switches 345 via the control input 341, the voltage driver compensation circuitry 340 provides voltage driver compensation to the output signal 123 to produce the output signal 123-1. In other words, the voltage driver compensation circuitry 340 controls the voltage driver trim switches 345 to sink or source current to the output signal 123 to provide voltage driver compensation.

Figure 6:
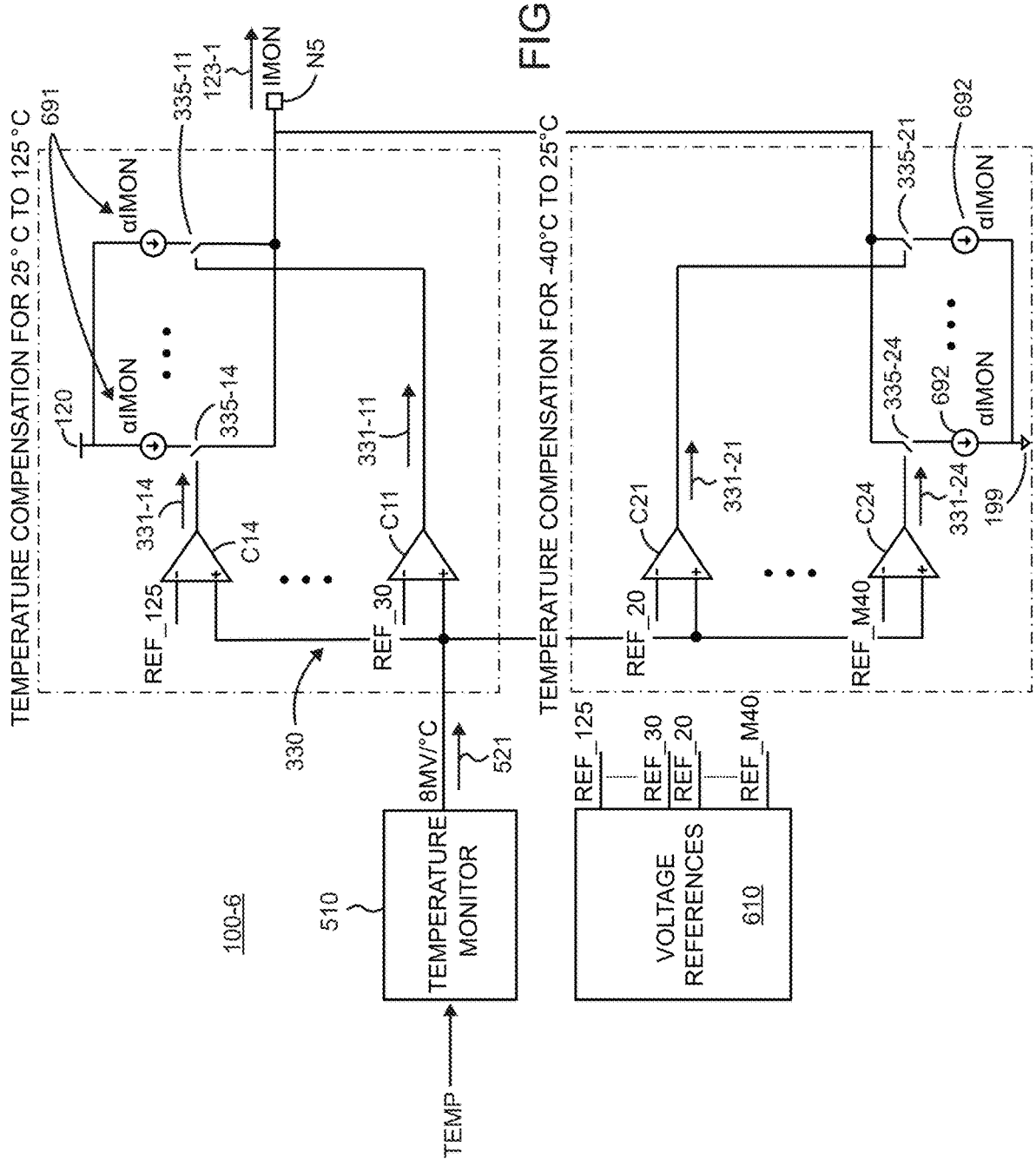
FIG. 6 is an example diagram illustrating implementation of temperature compensation circuitry as discussed herein.
Figure 7:
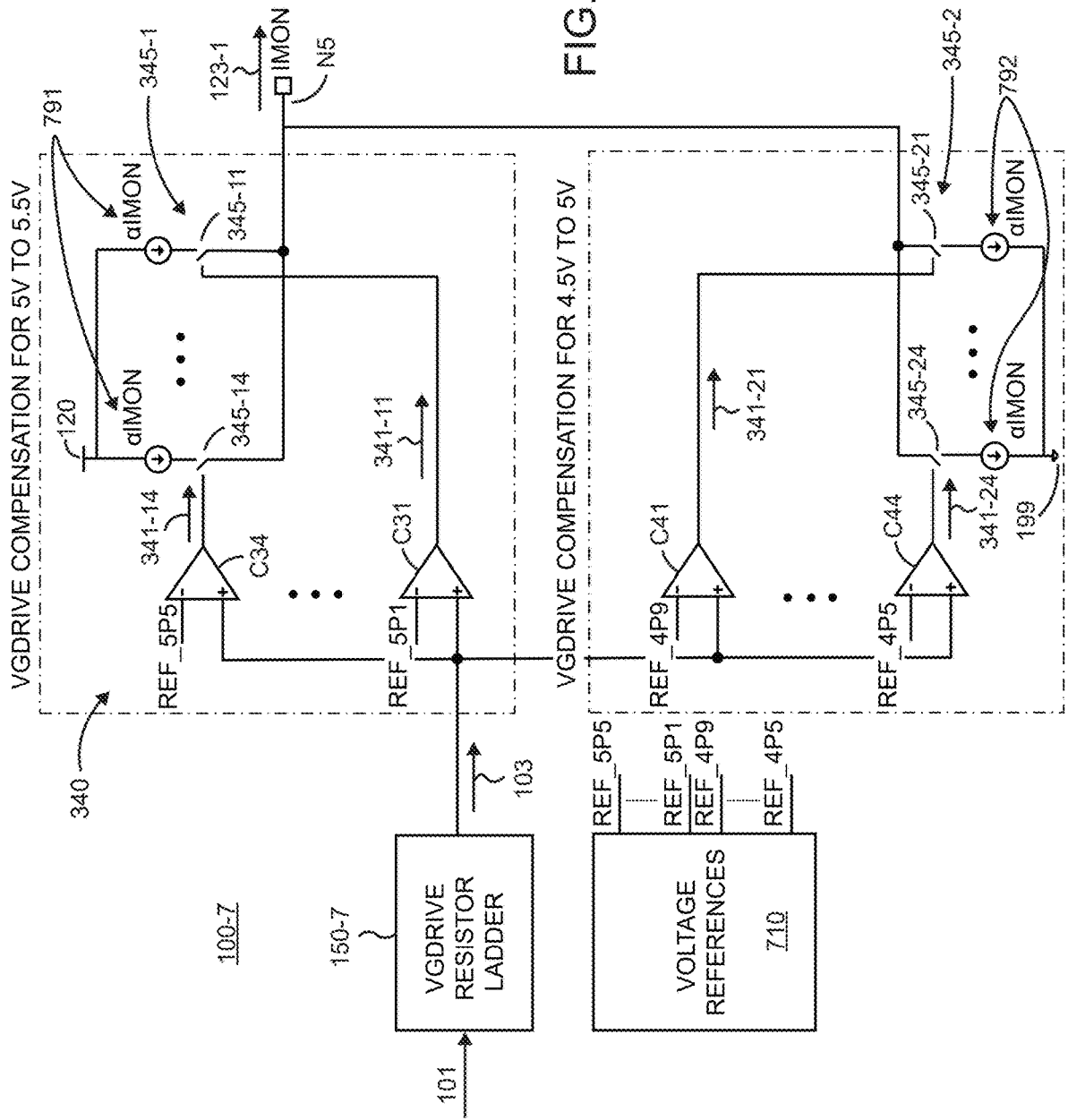
FIG. 7 is an example diagram illustrating implementation of gate drive compensation circuitry as discussed herein.

A more detailed example of the temperature compensation circuitry 330 is shown in FIG. 6. A more detailed example of the voltage driver compensation circuitry 340 is shown in FIG. 7.

FIG. 6 is an example diagram illustrating implementation of temperature compensation circuitry as discussed herein.

In this example, the circuit 100-6 further includes the reference voltage generator 610. As shown, the reference voltage generator 610 produces different reference voltages such as reference voltage ref 125 (corresponding to 125 degrees Celsius), . . . , ref 30 (corresponding to 30 degrees Celsius), ref 20 (corresponding to 20 degrees Celsius), . . . , ref minus 40 (corresponding to minus 40 degrees Celsius).

The temperature compensation circuitry 330 producing the control signals 331 or control input can be configured to include multiple comparators such as comparator C14, . . . , comparator C11, comparator C21, . . . , comparator C24. In one example, the combination of comparators is an analog-to-digital converter producing the respective control input 331 inputted to the temperature trim switches 335.

As shown, each of the comparators receives a respective threshold level (reference voltage) generated by the reference voltage generator 610. Each of the comparators also receives the temperature signal 521. As their names suggest, the comparators compare the received temperature signal 521 to their corresponding received reference voltage to produce a respective control signal whether or not to activate a corresponding switch.

More specifically, the comparator C14 compares the received temperature signal 521 to the reference voltage ref 125 to produce the control signal 331-14 that controls control switch 335-14; . . . ; the comparator C11 compares the received temperature signal 521 to the reference voltage ref 30 to produce the control signal 331-11 that controls switch 335-11; the comparator C21 compares the received temperature signal 521 to the reference voltage ref 20 to produce the control signal 331-21 that controls switch 335-21; . . . ; the comparator C24 compares the received temperature signal 521 to the reference voltage ref m40 to produce the control signal 331-24 that controls switch 335-24.

Thus, the control input 331 outputted from the temperature compensation circuitry 330 and inputted to the respective switches 335 can be configured to include control signal 331-14 generated by the comparator C14, . . . , control signal 331-11 generated by the comparator C11, control signal 331-21 generated by the comparator C21, . . . , control signal 331-24 generated by the comparator C24.

As further shown, the first switches 335-1 include sequence of switches including switch 335-11 through switch 335-14. The second switches 335-2 include sequence of switches including switch 335-21 through switch 335-24. As previously discussed, the first switches and the second switches may include any number of switches.

For each respective comparator, when a magnitude of the received signal is greater than the corresponding reference threshold level at the inverting input node for a given comparator, that comparator activates the respective switch to sink or source current to the node N5.

In this example, the temperature compensation circuitry 330 activates a different number of the first switches 335-1 depending upon a corresponding first temperature range (25 degrees Celsius to 125 degrees Celsius) in which the temperature signal 521 resides. Note that each corresponding circuit path (associated with switches 335-11 . . . 335-14 that sources current from the voltage source 120) can be configured to provide a predetermined quantum of current to the node N5. Note that each corresponding circuit path (associated with switches 335-21 . . . 335-24 that sinks current to ground) can be configured to sink a predetermined quantum of current from the node N5 to the ground reference potential 199.

For example, the greater the detected temperature TEMP with respect to a threshold value such as 25 degrees Celsius, the greater the number of switches 335-1 (such as one or more of switch 331-11, . . . , switch 331-14) that are activated to source current from the voltage source 120 to the node N5 to provide compensation.

Conversely, the greater the magnitude of the detected temperature below the threshold value such as 25 degrees Celsius, the greater the number of switches 335-2 (such as one or more of switch 335-21, . . . , switch 335-24) that are activated to sink current from node N5 to provide compensation.

Note that the number of comparators and corresponding sourcing and sinking current paths may vary depending upon the application.

Accordingly, examples herein include temperature compensation circuitry 330 operative to: i) receive a temperature value (temperature signal 521) generated by a temperature sensor circuit 510 such as disposed on or near a semiconductor chip including the second switch 132, and ii) adjust a magnitude of the output signal 123 to produce the compensated output signal 123-1 as a function of a magnitude of the received temperature value (temperature signal 521).

In accordance with a further example, as shown in FIG. 6, the temperature compensation circuitry 330 can be configured to source supplemental current from the voltage source 120 to the node N5 to produce the output signal 123-1 during a first condition in which the magnitude of the temperature value is above a threshold level such as 25 degrees Celsius. The temperature compensation circuitry 330 can be configured to sink current from the node N5 to the ground reference potential 199 to produce the output signal 123-1 during a second condition in which the magnitude of the temperature value is below a threshold level such as 25 degrees Celsius. In one example, if the magnitude of the temperature signal 521 falls between the reference voltage ref 30 and the reference voltage ref 20 (meaning that the temperature signal 521 is approximately 25 degrees Celsius), none of the switches 335-1 or switches 335-2 are activated. In such an instance, the output signal 123 is not compensated with sink or source current to produce the final output signal 123-1.

FIG. 7 is an example diagram illustrating implementation of gate drive compensation circuitry as discussed herein.

As shown in this example, the voltage drive monitor 150-7 receives the control signal 101 and converts it into the control signal 103.

Further in this example, the circuit 100-7 includes the reference voltage generator 710. As shown, the reference voltage generator 710 produces different reference voltages such as reference voltage ref-5p5, . . . reference voltage ref-5p1, reference voltage ref-4p9, . . . reference voltage ref-4p5.

The voltage driver compensation circuitry 340 can be configured to include multiple comparators such as comparator C34, . . . , comparator C31, comparator C41, . . . , comparator C44. In one example, the combination of comparators is an analog-to-digital converter producing the respective control input 341.

As shown, each of the comparators receives a respective threshold level (reference voltage) generated by the reference voltage generator 710. Each of the comparators also receives the control signal 103 generated by the voltage drive monitor 810. As their names suggest, the comparators compare the received signal 103 (such as a proportion of the magnitude of the control signal 101) to their corresponding received reference voltage to produce a respective control signal whether or not to activate a corresponding switch.

More specifically, the comparator C34 compares the received control signal 103 to the voltage driver reference voltage ref 5p5 to produce the control signal 341-14; . . . ; the comparator C31 compares the received control signal 103 to the reference voltage ref 5p1 to produce the control signal 341-11; the comparator C41 compares the control signal 103 to the reference voltage ref 4p9 to produce the control signal 341-21; . . . ; the comparator C44 compares the received control signal 103 to the reference voltage ref 4p5 to produce the control signal 341-24.

The control input 341 outputted from the voltage driver compensation circuitry 340 can be configured to include control signal 341-14 generated by the comparator C34 that controls the respective switch 345-14, . . . , control signal 341-11 generated by the comparator C31 that controls the switch 345-11, control signal 341-21 generated by the comparator C41 that controls the switch 345-21, . . . , control signal 341-24 generated by the comparator C44 that controls the switch 345-24.

As further shown, the first switches 345-1 include sequence of switches including switch 345-11 through switch 345-14. The second switches 345-2 include sequence of switches including switch 345-21 through switch 345-24.

For each respective comparator, when a magnitude of the received signal 103 is greater than the corresponding reference threshold level at the inverting input node, that comparator activates the respective switch to sink or source current to the node N5.

In this example, the voltage driver compensation circuitry 340 activates a different number of the first switches 345-1 depending upon a corresponding first driver voltage range (such as between 5 volts and 5.5 volts) in which the driver voltage resides.

For example, the greater the detected magnitude of the control signal 101 with respect to a threshold value such as 5 volts DC, the greater the number of switches 345-1 (such as one or more of switch 341-11, . . . , switch 341-14) that are activated to source current from the voltage source 120 to the node N5 to provide compensation. Conversely, the greater the magnitude of the detected control signal 103 below the threshold value such as 5 volts DC, the greater the number of switches 345-2 (such as one or more of switch 345-21, . . . , switch 345-24) that are activated to sink current from node N5 to provide compensation.

Accordingly, examples herein include driver voltage compensation circuitry 340 operative to: i) receive a control signal 101 converted into signal 103, and ii) adjust a magnitude of the output signal 123 to produce the compensated output signal 123-1 as a function of a magnitude of the received control signal 103.

Note that the number of comparators and corresponding sourcing and sinking current paths may vary depending upon the application.

In accordance with a further example, as shown in FIG. 7, the driver voltage compensation circuitry 340 can be configured source supplemental current from the voltage source 120 to the node N5 to produce the output signal 123-1 during a first condition in which the magnitude of the control signal 101 (a.k.a., driver voltage) is above a threshold level such as 5 volts. The driver voltage compensation circuitry 340 can be configured sink supplemental current from the node N5 to the ground reference potential 199 to produce the output signal 123-1 during a second condition in which the magnitude of the control signal 101 is below a threshold level such as 5 volts DC.

In one example, if the magnitude of the control signal 103 falls between the reference voltage ref 4p9 (associated with 4.9 volts DC) and the reference voltage ref 5p1 (associated with 5.1 volts DC) (meaning that the magnitude of the control signal 103 is approximately 5 volts DC), none of the switches 345-1 or switches 345-2 are activated. In such an instance, the output signal 123 is not compensated with sink or source current to produce the final output signal 123-1.

Accordingly, the driver voltage compensation circuitry as discussed herein can be configured to: i) receive a drive voltage value such as control signal 101, and ii) adjust the output signal 123 to produce the compensated output signal 123-1 as a function of the received drive voltage.

Additionally, in accordance with the above example, the driver voltage compensation circuit 340 is operative to source supplemental current from the voltage source 120 to the N5 during a first condition in which the magnitude of the drive voltage value is above a threshold level such as 5 volts or other suitable value. The driver voltage compensation circuit 340 is operative to sink supplemental current from the node N5 to the ground reference voltage potential 199 during a second condition in which the magnitude of the drive voltage value is below the threshold level such as 5 volts or other suitable value.

Figure 8:
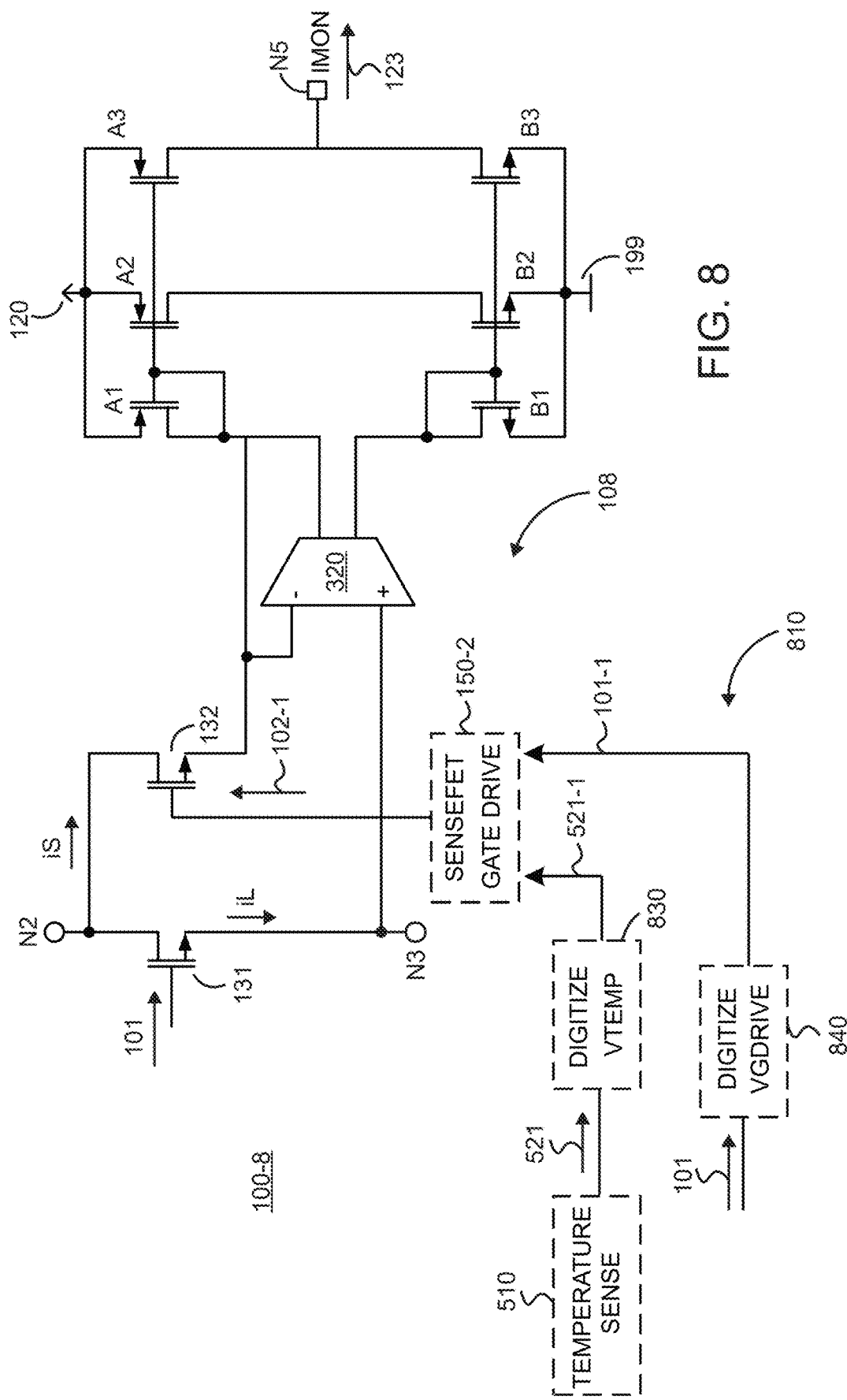
FIG. 8 is an example diagram illustrating implementation of temperature compensation circuitry and gate drive compensation circuitry as discussed herein.

FIG. 8 is an example diagram illustrating implementation of temperature compensation circuitry and gate drive compensation circuitry to control a sense of transistor as discussed herein.

In this example, the compensation circuitry 150-2 (a.k.a., signal generator) uses temperature information (such as digital temperature signal 521-1 and a digital control signal 101-1) as a basis in which to provide compensation adjustments to a magnitude of the control signal 102 to produce the control signal 102-1. The compensation circuitry 150-2 can be configured to apply the control signal 102-1 to the gate node G of the switch 132. This reduces the variations on sensefet current (a.k.a., iS) which then reflects as reduced variations on the current monitor output (output signal 123) yielding good accuracy. In other words, instead of applying the temperature and driver voltage compensation via sinking and sourcing current to the output signal 123 as previously discussed, the circuitry 100-8 in FIG. 8 implements the corresponding compensation circuitry 810 to provide compensation.

In one example, the compensation circuitry 810 includes one or more of temperature sensor circuit 510, signal converter circuit 830 such as an analog to digital converter or other suitable circuit, signal converter circuit 840 such as an analog to digital converter or other suitable circuit, and the compensation circuitry 150-2 to appropriately adjust the magnitude of the control signal 102-1 applied to the gate node of switch 132 such that the output signal 123 generated by the circuitry 100-8 and outputted from the node N5 more accurately indicates a magnitude of the first current (IL) through the switch 131.

Accordingly, the circuitry as discussed herein can be configured to include a signal generator (such as signal converter circuit 830, signal converter circuit 840, and compensation circuitry 150-2) operative to: i) receive a first control signal 101 applied to the first switch 131, ii) receive a temperature signal 521 indicating a temperature of the second switch 132 or corresponding semiconductor chip 202, iii) produce a drive signal (control signal 102-1) based on the first control signal 101 and the temperature signal 521, and iv) apply the derived drive signal 102-1 to a gate node G of the second switch 132.

Thus, a gate node G of the switch 131 receives the control signal 101. As previously discussed, the first control signal 101 controls operation of the switch 131 between ON-states and OFF-states. The control signal 101 applied to the switch 131 controls a magnitude of a resistance between a drain node D and a source node S of the first switch 131. The compensation circuitry 150-2 is operative to: i) receive control signal 101-1 derived from the first control signal 101, the second signal 101-1 may be a digital signal indicating a magnitude of the first control signal 101, ii) receive a temperature signal 521-1 indicating a temperature of the second switch 132 or the semiconductor chip 202, iii) produce an adjusted drive signal 102-1 based on the second signal 101-1 and the temperature signal 521-1, and iv) apply the drive signal 102-1 to a gate node G of the second switch 132 to provide compensation as discussed herein.

In this example, the adjusted drive signal 102-1 provides temperature compensation as well as driver voltage compensation to produce a more accurate output signal 123 indicating a magnitude of the current iL through the switch 131.

Figure 9:
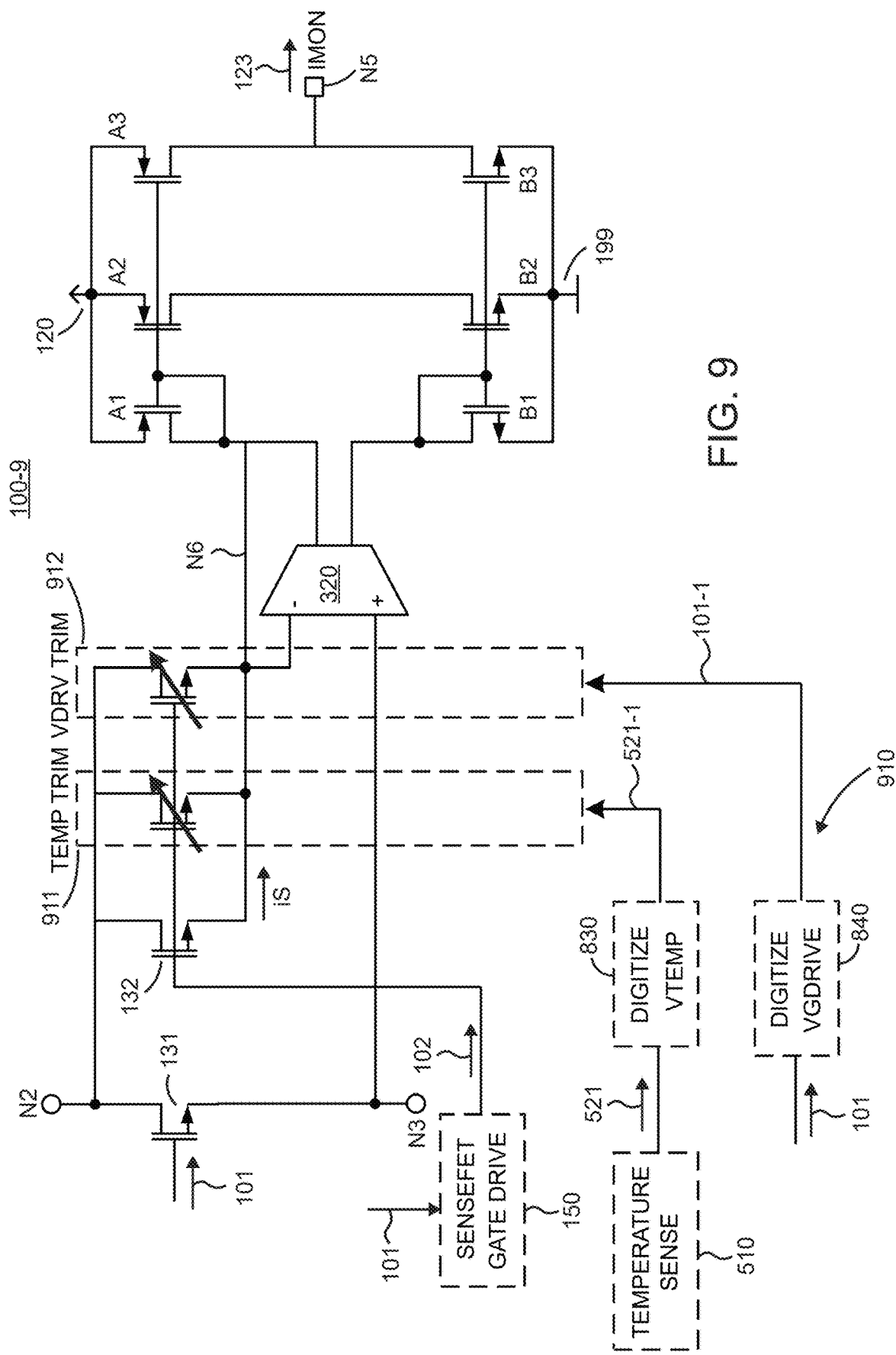
FIG. 9 is an example diagram illustrating implementation of gate drive compensation circuitry and temperature compensation circuitry as discussed herein.

FIG. 9 is an example diagram illustrating implementation of gate drive compensation circuitry and temperature compensation circuitry as discussed herein.

In this example, the circuit 100-9 uses temperature variation information to vary the sensefet (switch 132) ratio to compensate this variation. The circuit 100-9 uses gate drive variation information to vary the sensefet ratio to compensate this variation. This reduces the variations on sensefet current (iS) which then reflects as reduced variations on the current monitor output 123 yielding good accuracy of same.

More specifically, the current monitor circuitry 108 includes temperature trim switch circuitry 911 such as including one or more temperature trim switches disposed in parallel with the second switch 132. Additionally, the current monitor circuitry 108 includes driver voltage trim switch circuitry 912 including one or more drive voltage trim switches disposed in parallel with the second switch 132. The switch circuitry 911 and the switch circuitry 912 are part of the current mirroring circuit such as including switch 131 and switch 132.

In one example, the compensation circuitry 910 includes one or more of temperature sensor circuit 510, signal converter circuit 830 such as an analog to digital converter, signal converter circuit 840 such as an analog to digital converter, temperature trim switch circuitry 911 (such as one or more switches disposed in parallel with the switch 132), and drive voltage trim switch circuitry 912 (such as one or more switches disposed in parallel with the switch 132).

As further shown, the setting of the bits in the temperature signal 521-1 are used to control operation of the temperature trim switch circuitry 911. For example, depending on the temperature, to provide temperature compensation and adjustment to the current iS as discussed herein, the signal converter circuit 830 controls the temperature trim switch circuitry 911 to source an appropriate magnitude of supplemental current (a.k.a., compensation current) from the node N2 to the node N6, adjusting the magnitude of the signal is supplied to node N6 and converted into the output signal 123.

As further shown, the setting of the bits in the driver voltage signal 101-1 are used to control operation of the driver voltage switch circuitry 912. For example, to provide driver voltage compensation and adjustment to the current iS, depending on the magnitude of the control signal 101 as indicated by the control signal 101-1, the signal converter 840 controls the driver voltage trim switch circuitry 912 to source an appropriate magnitude of supplemental current (a.k.a., compensation current) from the node N2 to the node N6, adjusting the magnitude of the signal iS supplied to node N6.

Figure 10:
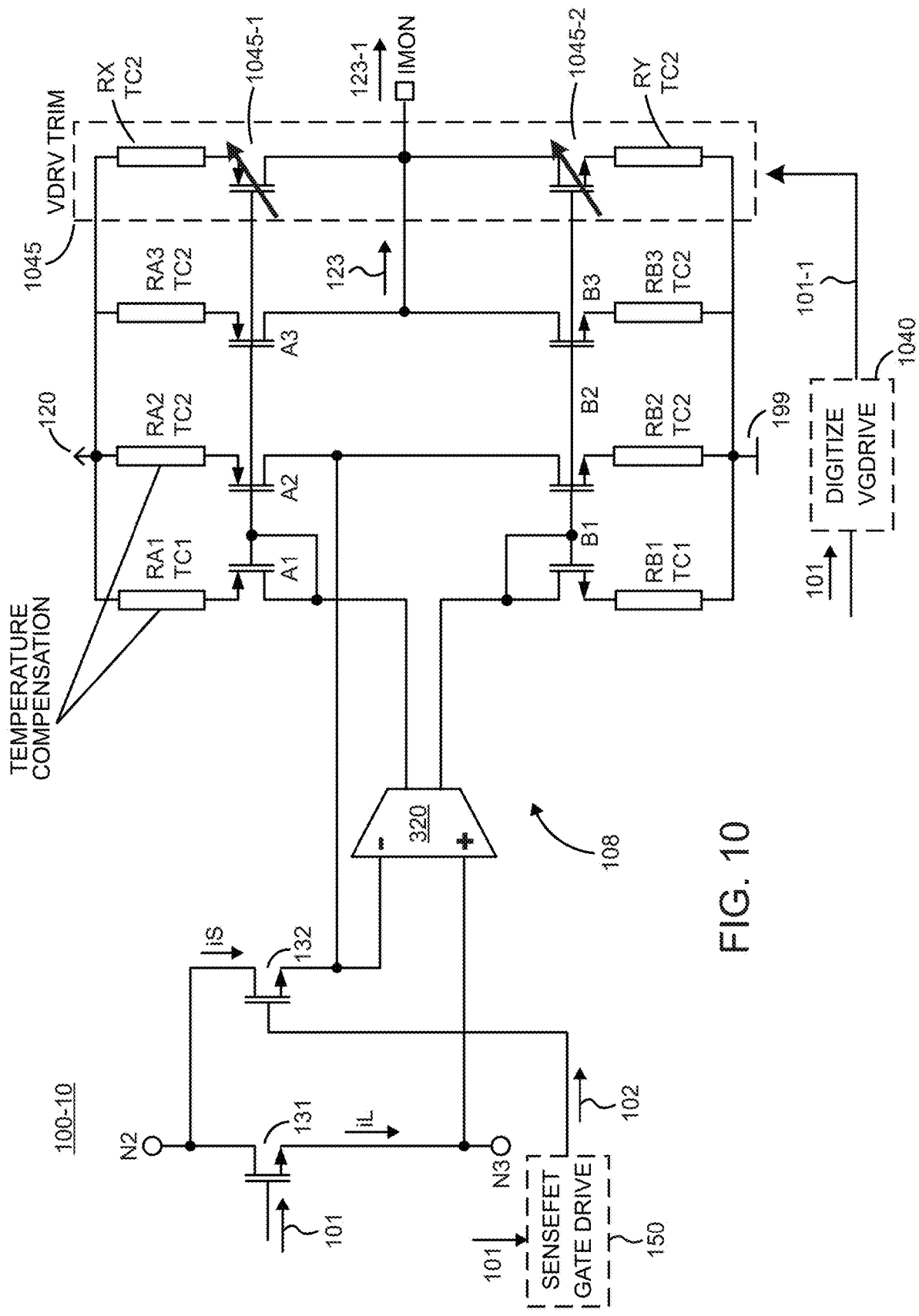
FIG. 10 is an example diagram illustrating implementation of temperature compensation using different types of resistive material having different temperature coefficients as discussed herein.

FIG. 10 is an example diagram illustrating implementation of resistive paths using different types of resistive material having different temperature coefficients as discussed herein.

In this example, the circuitry 100-10 uses temperature coefficient gradient difference between two types of resistor in the current mirror to implement the temperature correction associated with the current monitor output. This includes varying the gate drive voltage of the sensefet (switch 132) in relation to the variation of the gate drive of the powerfet switch 131) in a manner as previously discussed. Additionally, the circuit 100-10 can be configured to include signal converter 1040 to digitize the received control signal 101 into control signal 101-1. The control signal 101-1 is used to control states of respective voltage driver trim switches associated with the voltage driver trim switch circuitry 1045.

For example, as previously discussed, if the control signal 101 is greater than 5 volts, the signal converter 1040 controls one or more of the switches in switch circuitry 1045-1 to an on state to supply first compensation current from the voltage source 120 to the node N5.

Conversely, if the control signal 101 is less than 5 volts, the signal converter 1040 controls one or more of the switches in switch circuitry 1045-2 to an on state to sink second compensation current from the node N5 to the ground reference voltage potential 199.

In such an instance, control of the respective voltage driver trim switch circuitry 1045 trims a magnitude of the output signal 123 to produce output signal 123-1 such that signal 123-1 more accurately indicates a magnitude of the first current iL through the switch 131.

More specifically, the current monitor circuitry 108 includes first resistors such as resistor RA1 and resistor RB1 fabricated using a first material (temperature coefficient TC1) such as a low temperature coefficient resistive material.

The current monitor circuitry 108 further includes second resistors (such as resistor RA2, resistor RA3 fabricated using second material (temperature coefficient TC 2) such as a high temperature coefficient resistive material.

Thus, in one example, a magnitude of the first temperature coefficient TC1 is less than a magnitude of the second temperature coefficient TC2.

As shown, the resistors are disposed in the current mirror circuit of the current monitor circuitry 108. Each of the resistors, depending upon a corresponding resistance setting which changes with temperature, supports temperature compensation. For example, resistors RA1, RA2, RA3, changes temperature gradient of corresponding current supplied from the voltage source 120 through activated switch A1, A2, A3. Resistors RB1, RB2, RB3, changes temperature gradient of corresponding current sunk from a respective node to the ground reference potential 199.

Additionally, in this example, the switch 131 has a first RDSon temperature coefficient; the second switch 132 has a second RDSon temperature coefficient. A magnitude of a first ratio of the second temperature coefficient TC2 to the first temperature coefficient TC1 is substantially equal to a magnitude of a second ratio of the second RDSon temperature coefficient to the first RDSon temperature coefficient. In such an instance, the first resistive material (having temperature coefficient TC1) and the second resistive material (temperature coefficient TC2) are operable to provide temperature compensation of converting the second current iS into an output signal 123 accurately indicating a magnitude of the first current iL.

As further shown, the circuit 100-10 includes voltage drive trim circuitry 1045. The voltage drive trim circuitry 1045 includes switch circuitry 1045-1 (one or more switches) in parallel with the switches A1, A2, A3. Additionally, the voltage drive trim circuitry 1045 includes switch circuitry 1045-2 (such as one or more switches) in parallel with the switches B1, B2, B3. Yet further, the circuit 100-10 includes the signal converter 1040 that receives control signal 101 and converts into the digital control signal 101-1 that controls operation of the respective switch circuitry 1045-1 and switch circuitry 1045-2 in a similar manner as previously discussed. However, in this example, the resistors RX disposed in the circuit paths provided by the switch circuitry 1045 modify the temperature gradient of the source current supplied from the voltage source 120 through the one or more circuit paths (including resistors RX fabricated using temperature coefficient TC2). The resistors RY disposed in the circuit paths provided by the switch circuitry 1045 modify the temperature gradient of the current sinked from the node N5 through the one or more circuit paths (including resistors RY fabricated using temperature coefficient TC2) to the ground reference potential 199. In such an instance, the source compensation current supplied by the switch circuitry 1045-1 is temperature corrected via use of the resistive material having temperature coefficient TC2; the sink compensation current supplied by the switch circuitry 1045-2 is temperature corrected via use of the resistive material having temperature coefficient TC2.

Figure 11:
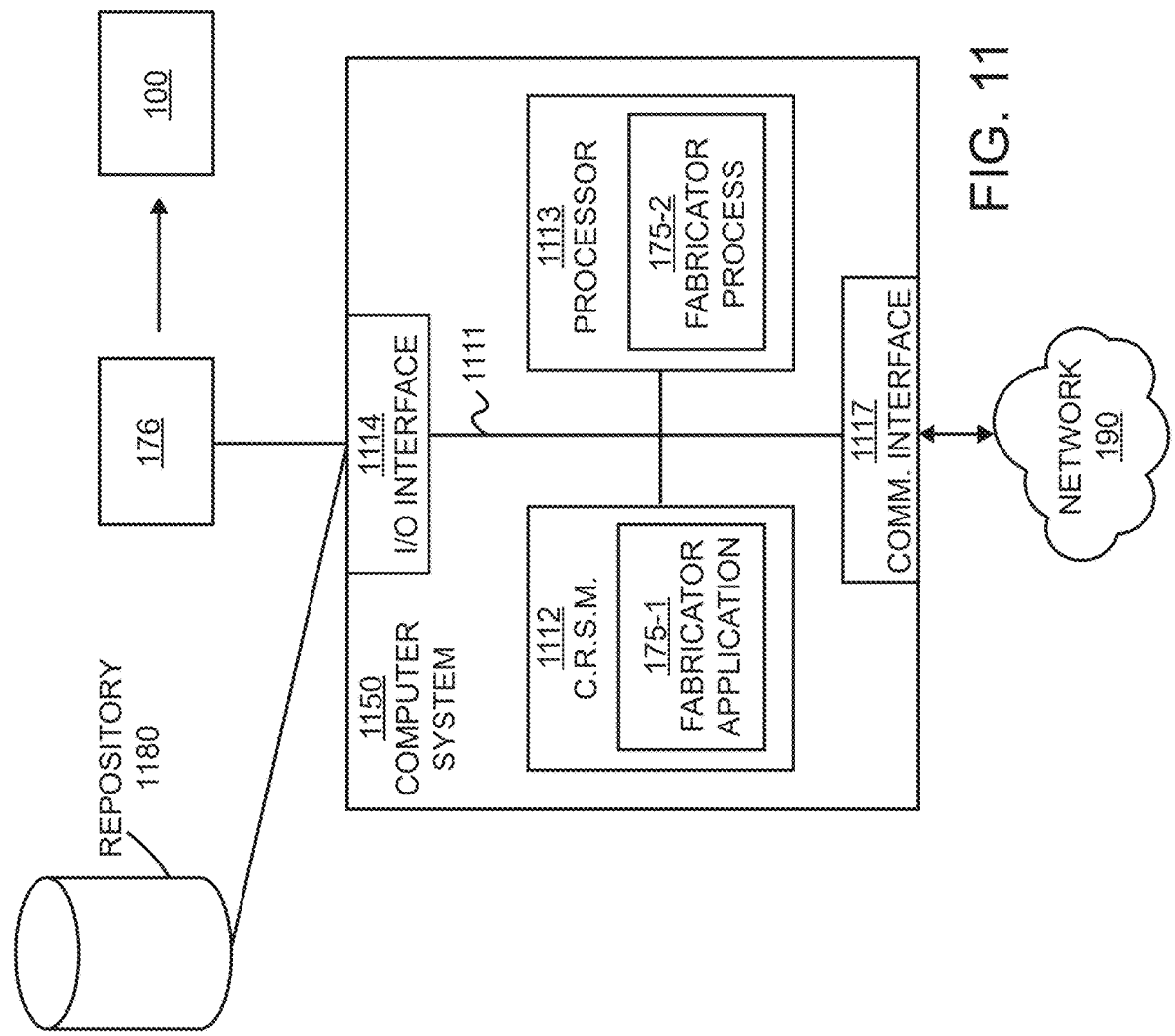
FIG. 11 is an example diagram illustrating example computer hardware and software operable to execute fabrication operations as discussed herein.

FIG. 11 is an example diagram illustrating example computer hardware and software operable to execute fabrication operations as discussed herein.

Note that any of the resources (such as associated with fabricator 175, etc.) as discussed herein can be configured to include computer processor hardware and/or corresponding executable instructions to carry out the different operations as discussed herein. In one example, the fabricator 175 includes any equipment (hardware, machines, etc.) to produce the apparatus (such as circuit 100) as discussed herein. In one example, the fabricator 175 controls operation of the fabrication equipment 176 to produce the circuit 100 as discussed herein.

For example, as shown, computer system 1150 of the present example includes interconnect 1111 coupling computer readable storage media 1112 such as a non-transitory type of media or computer readable storage hardware (which can be any suitable type of resource in which digital information can be stored and/or retrieved), a processor 1113 (computer processor hardware), I/O interface 1114, and a communications interface 1117.

I/O interface(s) 1114 supports connectivity to repository 1180 and input resource 1192.

Computer readable storage medium 1112 can be any hardware storage device such as memory, optical storage, hard drive, floppy disk, etc. In one embodiment, the computer readable storage medium 1112 (computer readable storage hardware) stores instructions and/or data.

As shown, computer readable storage media 1112 can be encoded with fabricator application 175-1 in a respective one or more network nodes to carry out any of the operations as discussed herein.

During operation of one example, processor 1113 accesses computer readable storage media 1112 via the use of interconnect 1111 in order to launch, run, execute, interpret or otherwise perform the instructions in fabricator application 175-1 stored on computer readable storage medium 1112. Execution of the fabricator application 175-1 produces fabricator process 175-2 to carry out any of the operations and/or processes as discussed herein.

Those skilled in the art will understand that the computer system 1150 can include other processes and/or software and hardware components, such as an operating system that controls allocation and use of hardware resources to execute the fabricator application 175-1.

In accordance with different embodiments, note that computer system may reside in any of various types of devices, including, but not limited to, a mobile computer, a personal computer system, a wireless device, a wireless access point, a base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 1150 may reside at any location or can be included in any suitable resource in any network environment to implement functionality as discussed herein.

Functionality supported by the different resources will now be discussed via flowchart 1200 in FIG. 12. Note that the steps in the flowcharts below can be executed in any suitable order.

Figure 12:
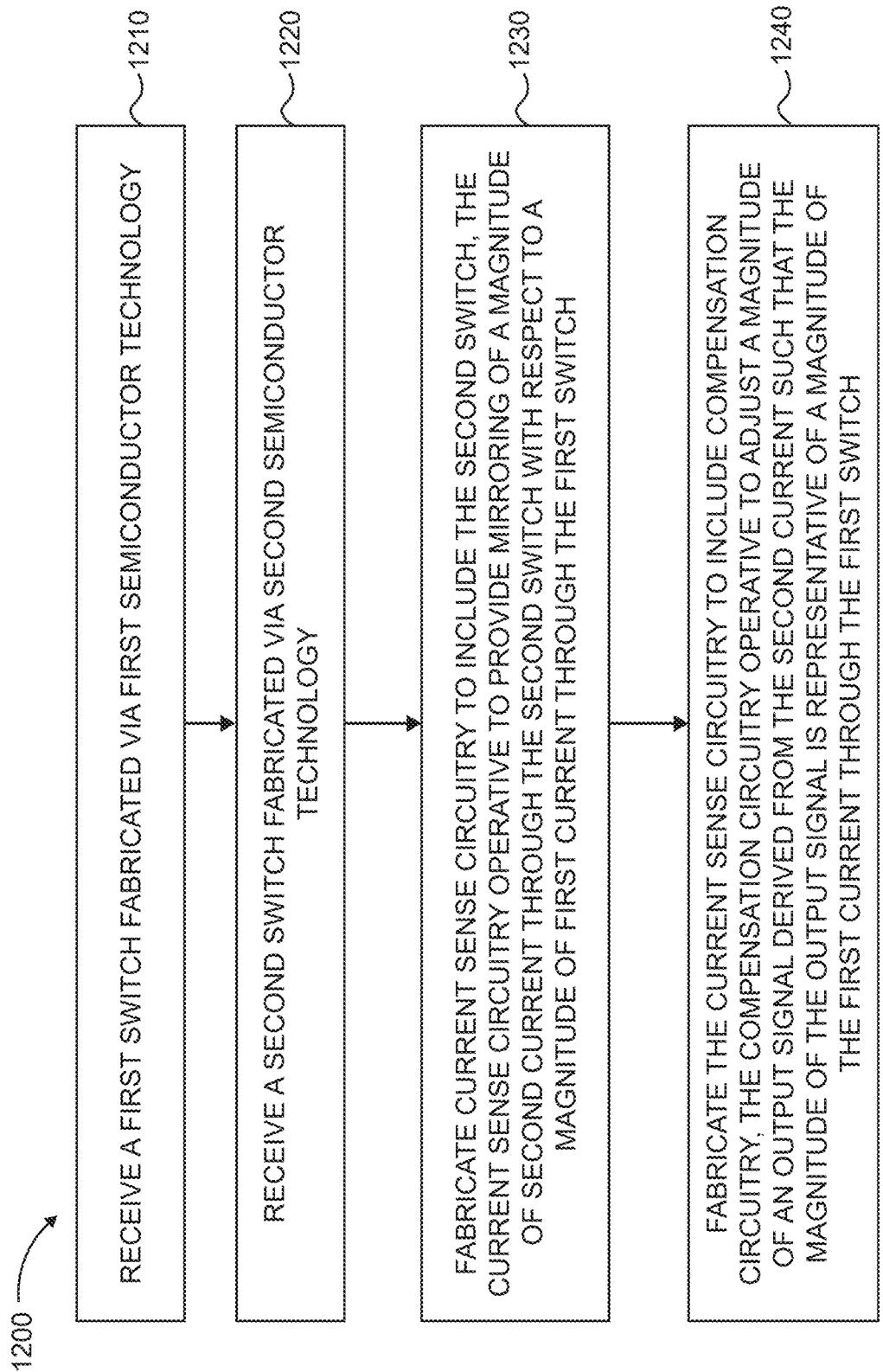
FIG. 12 is an example diagram illustrating a method as discussed herein.

FIG. 12 is an example diagram illustrating a method as discussed herein.

In processing operation 1210, the fabricator 175 receives a first switch 131 fabricated via first semiconductor technology.

In processing operation 1220, the fabricator 175 receives a second switch 132 fabricated via second semiconductor technology.

In processing operation 1230, the fabricator 175 fabricated the current monitor circuitry 108 to include the second switch 132. The current monitor circuitry 108 is fabricated to provide mirroring of second current through the second switch with respect to first current through the first switch.

In processing operation 1240, the fabricator 175 fabricates the current monitor circuitry 108 to include compensation circuitry such as temperature compensation circuitry 330, voltage drive compensation circuitry 340, and/or signal converter circuitry 150. The compensation circuitry is configured to adjust a magnitude of an output signal 123 derived from the second current iS such that the magnitude of the output signal 123 is representative of a magnitude of the first current iL through the first switch 131.

Figure 13:
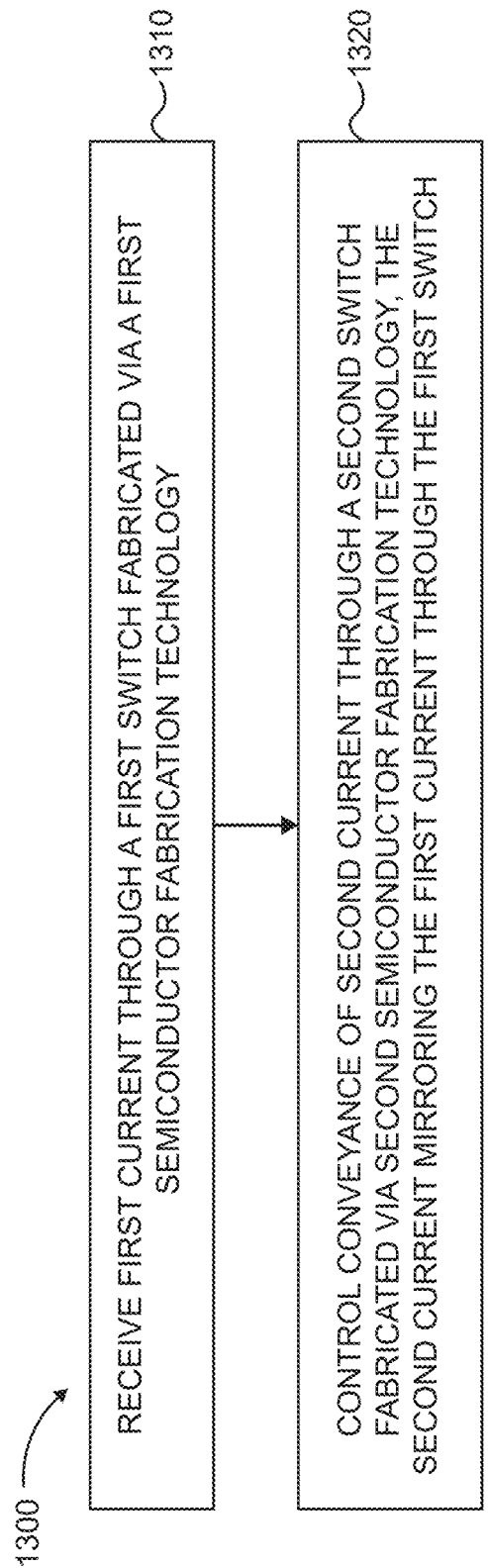
FIG. 13 is an example diagram illustrating a method as discussed herein.

FIG. 13 is an example diagram illustrating a method as discussed herein.

In processing operation 1310, the circuit 100 (such as apparatus or other suitable entity) receives first current iL through a first switch 131 fabricated via a first semiconductor fabrication technology.

In processing operation 1320, the circuit 100 controls conveyance of second current is through a second switch 132 fabricated via second semiconductor fabrication technology. The second current iS through the second switch 132 mirrors the first current iL through the first switch 131.

Note again that techniques herein are well suited for use in current sensing applications which implements current mirroring for generation of a respective output signal indicative of current through a power switch. However, it should be noted that the disclosure of matter herein is not limited to use in such applications and that the techniques discussed herein are well suited for other applications as well.

While this invention has been particularly shown and described with references to preferred aspects thereof, it will be understood by those skilled in the art that various changes in form and details may be made therein without departing from the spirit and scope of the present application as defined by the appended claims. Such variations are intended to be covered by the scope of this present application. As such, the foregoing description in the present disclosure is not intended to be limiting. Rather, any limitations to the invention are presented in the following claims.

We claim:
1. An apparatus comprising:
a first switch fabricated via first semiconductor fabrication technology;
a second switch fabricated via second semiconductor fabrication technology; and
current monitor circuitry including the second switch, the current monitor circuitry operative to provide mirroring of second current through the second switch with respect to first current through the first switch.
2. The apparatus as in claim 1, wherein a magnitude of the second current (iS) is a proportion of a magnitude of the first current (iL) such that iS=(1/N)*iL, where N is a ratio value.
3. The apparatus as in claim 1 further comprising:
a first node operative to receive a first control signal controlling operation of the first switch, the controlled operation of the first switch controlling a magnitude of a first resistance between a drain node of the first switch and a source node of the first switch; and
a signal converter operative to convert the first control signal received at the first node into a second control signal operative to control operation of the second switch, the second control signal operative to control a second resistance between a drain node of the second switch and a source node of the second switch such that a magnitude of the second current through the second switch is proportional to the magnitude of the first current through the first switch.
4. The apparatus as in claim 3, wherein the second control signal is applied to a gate node of the second switch.
5. The apparatus as in claim 3, wherein the signal converter includes a resistor divider circuit operative to produce a magnitude of the second control signal as a proportion of a magnitude of the first control signal.
6. The apparatus as in claim 3, wherein the first control signal varies within a first voltage range; and
wherein the signal converter is operative to control a magnitude of the second control signal within a second voltage range, the second voltage range smaller than the first voltage range.
7. The apparatus as in claim 1, wherein the first switch is a power switch fabricated on a first semiconductor chip, the first switch fabricated in accordance with MOSFET (Metal Oxide Semiconductor Field Effect Transistor) technology; and
wherein the second switch is fabricated on a second semiconductor chip, the second semiconductor chip fabricated in accordance with CMOS (Complementary Metal Oxide Semiconductor) technology, the second semiconductor chip fabricated independent of the first semiconductor chip.
8. The apparatus as in claim 1, wherein the current monitor circuitry is operative to produce an output signal indicating a magnitude of the first current, the apparatus further comprising:
a temperature compensation circuit operative to: i) receive a temperature value generated by a temperature sensor circuit operative to monitor a temperature of a semiconductor chip including the second switch, and ii) adjust a magnitude of the output signal as a function of a magnitude of the temperature value.
9. The apparatus as in claim 1, wherein the current monitor circuitry is operative to generate an output signal indicating a magnitude of the first current based on a magnitude of the second current;
a temperature compensation circuit operative to: i) receive a temperature value indicative of a temperature of the second switch, and ii) adjust the output signal as a function of the received temperature value.

10. The apparatus as in claim 9, wherein the output signal is an output current, a magnitude of the output current indicating the magnitude of the first current;
wherein the temperature compensation circuit is operative to sink current from the output signal during a first condition in which a magnitude of the temperature value is below a threshold level; and
wherein the temperature compensation circuit is operative to source current to the output signal during a second condition in which the magnitude of the temperature value is above a threshold level.

11. The apparatus as in claim 1, wherein the current monitor circuitry is operative to generate an output signal indicating a magnitude of the first current based on a magnitude of the second current;
a driver voltage compensation circuit operative to: i) receive a drive voltage value indicative of a drive voltage applied to the first switch, and ii) adjust the output signal as a function of the received drive voltage.

12. The apparatus as in claim 11, wherein the output signal is an output current, a magnitude of the output current indicating the magnitude of the first current;
wherein the driver voltage compensation circuit is operative to sink current from the output signal during a first condition in which a magnitude of the drive voltage value is below a threshold level; and
wherein the temperature compensation circuit is operative to source current to the output signal during a second condition in which the magnitude of the drive voltage value is above a threshold level.

13. The apparatus as in claim 1 further comprising:
a signal generator operative to: i) receive a first control signal applied to the first switch, ii) receive a temperature signal indicating a temperature of the second switch, iii) produce a second control signal based on the first control signal and the temperature signal, and iv) apply the second control signal to a gate node of the second switch.

14. The apparatus as in claim 1 further comprising:
a first node operative to receive a first control signal, the first control signal operative to control the first switch, the control of the first switch operative to control a magnitude of a resistance between a source node of the first switch and a drain node of the first switch; and
a signal generator operative to: i) receive a second control signal derived from the first control signal, the second control signal indicating a magnitude of the first control signal, ii) receive a temperature signal indicating a temperature of the second switch, iii) produce a third control signal based on the combination of the second control signal and the temperature signal, and iv) apply the third control signal to a gate node of the second switch.

15. The apparatus as in claim 1, wherein the current monitor circuitry includes multiple switches connected in parallel with the second switch, the multiple switches including third switch circuitry and fourth switch circuitry;
a first signal converter operative to: i) receive a temperature signal indicating a temperature of the second switch, ii) convert the temperature signal into a first control signal applied to the third switch circuitry;
a second signal converter operative to: i) receive a switch driver signal applied to the first switch, ii) convert the switch drive signal into a second control signal applied to the fourth switch circuitry.

16. The apparatus as in claim 15, wherein the first control signal is operative to provide temperature compensation associated with generation of an output signal indicating a magnitude of the first current through the first switch, the output signal derived from the second current; and
wherein the second control signal is operative to provide drive voltage compensation associated with generation of the output signal.

17. The apparatus as in claim 1, wherein the current monitor circuitry further includes first resistors fabricated from first resistive material and second resistors fabricated from second resistive material, the first resistors and the second resistors disposed in current mirror circuit of the current monitor circuitry;
wherein the first resistive material has a first resistor temperature coefficient;
wherein the second resistive material has a second resistor temperature coefficient;
wherein the first switch has a first RDSon temperature coefficient;
wherein the second switch has a second RDSon temperature coefficient;
wherein a magnitude of a first ratio of the second resistor temperature coefficient to the first resistor temperature coefficient is substantially equal to a magnitude of a second ratio of the second switch RDSon temperature coefficient to the first switch RDSon temperature coefficient.

18. The apparatus as in claim 17, wherein the first resistive material and the second resistive material are operable to provide temperature compensation of converting the second current into an output signal indicating a magnitude of the first current.

19. The apparatus as in claim 18, wherein a magnitude of the first temperature coefficient is less than a magnitude of the second temperature coefficient.

20. A method comprising:
receiving first current through a first switch fabricated via a first semiconductor fabrication technology; and
controlling conveyance of second current through a second switch fabricated via second semiconductor fabrication technology, the second current mirroring the first current through the first switch via compensation circuitry.

* * * * *